US012265043B2

(12) United States Patent
Ogawa

(10) Patent No.: US 12,265,043 B2
(45) Date of Patent: Apr. 1, 2025

(54) INSPECTION APPARATUS

(71) Applicant: NuFlare Technology, Inc., Yokohama (JP)

(72) Inventor: Riki Ogawa, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 406 days.

(21) Appl. No.: 17/805,752

(22) Filed: Jun. 7, 2022

(65) Prior Publication Data

US 2022/0299456 A1 Sep. 22, 2022

Related U.S. Application Data

(63) Continuation of application No. PCT/JP2020/047723, filed on Dec. 21, 2020.

(30) Foreign Application Priority Data

Mar. 31, 2020 (JP) ................. 2020-063490

(51) Int. Cl.
*H01J 37/20* (2006.01)
*G01N 23/2251* (2018.01)
*G03F 1/86* (2012.01)
*H01J 37/06* (2006.01)
*H01J 37/244* (2006.01)

(52) U.S. Cl.
CPC .......... *G01N 23/2251* (2013.01); *G03F 1/86* (2013.01); *H01J 37/06* (2013.01); *H01J 37/244* (2013.01);
(Continued)

(58) Field of Classification Search
None
See application file for complete search history.

(56) References Cited

U.S. PATENT DOCUMENTS 7,189,655 B2  3/2007 Takaoka
2007/0040118 A1  2/2007 Cheng et al.
(Continued)

FOREIGN PATENT DOCUMENTS

JP  2006-59835 A  3/2006
JP  2007-53035 A  3/2007
(Continued)

OTHER PUBLICATIONS

Hirano et al., 'Study of EUV mask inspection using projection EB optics with programmed pattern defect' Proc. of SPIE vol. 8441, 84411G (Year: 2012).*
(Continued)

*Primary Examiner* — Eliza W Osenbaugh-Stewart
(74) *Attorney, Agent, or Firm* — Oblon, McClelland, Maier & Neustadt, L.L.P.

(57) ABSTRACT

Provided is an inspection apparatus including: an irradiation source irradiating an electron beam to a pattern of an inspection target object, the inspection target object having a first surface and a second surface having the pattern; a first voltage application circuit applying a first voltage to the first surface; a second voltage application circuit applying a second voltage to the second surface; and a detector for acquiring an inspection image generated from the pattern by irradiating the electron beam, wherein $|V_{acc}-V_L|=|V_2|<|V_1|$ is satisfied, when an acceleration voltage of an electron included in the electron beam is $V_{acc}$, an incident voltage of the electron reaching the second surface is denoted by $V_L$, the first voltage is denoted by $V_1$, and the second voltage is denoted by $V_2$.

9 Claims, 7 Drawing Sheets

(52) U.S. Cl.
CPC ............... *H01J 2237/2448* (2013.01); *H01J 2237/24592* (2013.01)

(56) References Cited

U.S. PATENT DOCUMENTS

| | | | |
|---|---|---|---|
| 2009/0084954 A1 | 4/2009 | Ezumi et al. | |
| 2009/0206253 A1* | 8/2009 | Saito | G01N 23/2251 250/307 |
| 2021/0134555 A1* | 5/2021 | Tanokuchi | H01J 37/20 |

FOREIGN PATENT DOCUMENTS

| | | |
|---|---|---|
| JP | 2009-99540 A | 5/2009 |
| JP | 2010-078657 A | 4/2010 |

OTHER PUBLICATIONS

Japanese Office Action issued Dec. 19, 2023 in Japanese Patent Application No. 2020-063490 (with unedited computer-generated English Translation), 5 pages.

International Search Report issued Feb. 22, 2021 in PCT/JP2020/047723, filed Dec. 21, 2020, (2 pages).

Taiwanese Office Action issued on Dec. 13, 2021 in Taiwan Application 110106198 filed on Feb. 23, 2021 (with Machine Generated English Translation) (8 pages).

International Preliminary Report on Patentability and Written Opinion issued Oct. 13, 2022 in PCT/JP2020/047723 (submitting English translation only), 5 pages.

Korean Office Action dated Nov. 5, 2024, issued in Korean Patent Application No. 10-2022-7032778 (with English translation).

* cited by examiner

INSPECTION APPARATUS

CROSS-REFERENCE TO RELATED APPLICATION

This application is continuation application of, and claims the benefit of priority from the International Application PCT/JP2020/047723, filed Dec. 21, 2020, which claims the benefit of priority from Japanese Patent Application No. 2020-063490, filed on Mar. 31, 2020, the entire contents of all of which are incorporated herein by reference.

FIELD OF THE INVENTION

Embodiments described herein relate generally to inspection apparatus.

BACKGROUND OF THE INVENTION

The present invention relates to a inspection apparatus For example, it relates to a inspection apparatus for inspecting a pattern by irradiating an electron beam onto an EUV (Extreme Ultraviolet) mask to acquire secondary electron images of the pattern emitted.

In recent years, a circuit line width required for semiconductor elements has been reduced with an increase in the degree of integration and capacity of large-scale integrated circuits (LSIs). These semiconductor elements are manufactured by exposing and transferring a pattern to a wafer with a reduced projection exposure apparatus called a stepper, using an original image pattern (also referred to as a mask or a reticle; hereinafter, generically referred to as a mask), on which a circuit pattern is formed, to form circuits.

Further, improvement in yield is indispensable in manufacturing an LSI that requires a large manufacturing cost. However, a processing size of less than 20 nm has already been achieved by liquid immersion exposure and multipatterning technology. In addition, microfabrication below 10 nm has been achieved by the practical use of extreme ultraviolet (EUV) exposure. Further, microfabrication techniques other than the techniques using an exposure machine, such as nano-imprinting lithography (NIL) and directed self-assembly (DSA) lithography, have been put to practical use. In recent years, with the miniaturization of the size of LSI patterns formed on semiconductor wafers, the size of an object that needs be detected as a pattern defect has become extremely small and the number of patterns that need to be inspected in the same area has become extremely large. Therefore, it is necessary to increase the accuracy and processing speed of the inspection apparatus that inspects the defects of the ultrafine patterns transferred onto the semiconductor wafer. In addition, one of the major factors that reduce the yield is a pattern defect of the mask used when an ultrafine pattern is exposed and transferred onto the semiconductor wafer by a photolithography technique. Therefore, it is necessary to increase the accuracy of the inspection apparatus that inspects the defects of a transfer mask used for LSI manufacturing.

As an inspection method, a method has been known which performs inspection by comparing an optical image obtained by capturing an image of a pattern formed on an inspection target object, for example, a wafer, such as a semiconductor wafer, or a mask, such as a lithography mask, at a predetermined magnification using an enlargement optical system with design data or an optical image obtained by capturing an image of the same pattern on the inspection target object. For example, as the inspection method, there are "die-to-die inspection" for comparing optical image data obtained by imaging the identical patterns at different locations on the same mask or "die-to-database inspection" for inputting writing data (design pattern data) converted into a device input format for a writing device to the inspection apparatus to generate design image data (reference image) on the basis of the data and comparing an optical image which is measurement data obtained by imaging the pattern with the design image data. In the inspection method in the inspection apparatus, inspection is performed by placing an inspection target substrate on a stage (target object stage) and scanning an inspection target object with a light beam while moving the stage. The inspection target substrate is irradiated with the light beam by a light source and an illumination optical system. An image is formed on a sensor by light transmitted through or reflected from the inspection target substrate through the optical system. The image captured by the sensor is transmitted as measurement data to a comparison circuit. The comparison circuit aligns the images, compares the measurement data and reference data according to an appropriate algorithm, and determines that there is a pattern defect in a case in which the measurement data and the reference data are not matched with each other.

In the inspection apparatus described above, the laser light is irradiated to the substrate to be inspected, and by imaging transmission image or reflection image, an optical image is obtained. On the other hand, in recent years, lithography (EUV-lithography) using EUV light source whose exposure wavelength is 13.5 nm has attracted attention. Compared with ArF immersion lithography using an ArF excimer laser with an exposure wavelength of 193 nm, the exposure wavelength/(NA) is ¼ to ⅕, so that a drastic improvement in resolving power can be expected in EUV lithography. Therefore, it is required to develop a device for inspecting defects in a EUV-mask.

EUV-mask is obtained by forming a buffer layer made of Si/Mo (molybdenum) multilayered film, Ru (ruthenium) or the like, which is a reflective film of EUV light, and an absorber having predetermined patterns on surfaces of extremely low thermal expansion glasses used as masking substrates, for example. As the absorber, for example, an alloy containing Ta (tantalum) has been proposed. Here, EUV light wavelengths are easily absorbed by materials, and lenses using light refractions cannot be used. For this reason, all projection optics are composed of reflection optics. Therefore, EUV-mask is also a reflective type mask as described above.

When inspecting EUV-mask, it is preferable to appropriately control incident voltage (Landing Voltage) or landing energy (Landing Energy) of the electron beam on the surface where EUV-mask pattern is provided in order to obtain high-resolution inspection images by suppressing the charging of EUV-mask. For the control of incident voltage, a method of changing the acceleration voltage of electrons contained in the electron beam and a method of applying a retarding voltage to EUV-mask to decelerate electrons contained in the electron beam can be considered. However, it is preferable to apply retarding voltrage to EUV-mask in order to precisely control the energy of the electrons in the surface where the pattern is provided to improve the resolution of the inspection image.

Here, since the mask substrate is made of low thermal expansion glass as described above, it is an insulator. Therefore, it is impossible to control the electronic energy by applying retarding voltrage to the mask substrate. On the other hand, the above-mentioned Si/Mo multilayered film has electric conductivity. Therefore, by applying a retarding voltrage to Si/Mo multilayer film, it is possible to apply retarding voltrage uniformly to the surface where EUV-mask is provided. However, if a separate area for applying retarding voltrage to the surface where the pattern is provided is provided, there is a problem that the number of semiconductor elements that can be manufactured by a single mask is reduced by the amount of the area for applying retarding voltrage.

SUMMARY OF THE INVENTION

The inspection apparatus of an aspect of the present invention includes: an irradiation source irradiating an electron beam to a pattern of an inspection target object, the inspection target object having a first surface and a second surface having the pattern; a first voltage application circuit applying a first voltage to the first surface; a second voltage application circuit applying a second voltage to the second surface; and a detector for acquiring an inspection image generated from the pattern by irradiating the electron beam, wherein $|V_{acc}-V_L|=|V_2|<|V_1|$ is satisfied, when an acceleration voltage of an electron included in the electron beam is $V_{acc}$, an incident voltage of the electron reaching the second surface is denoted by $V_L$, the first voltage is denoted by $V_1$, and the second voltage is denoted by $V_2$.

DETAILED DESCRIPTION OF THE EMBODIMENTS

Embodiments of the present invention will be described below with reference to the drawings.

EMBODIMENTS

The inspection apparatus of an aspect of the present invention includes: an irradiation source irradiating an electron beam to a pattern of an inspection target object, the inspection target object having a first surface and a second surface having the pattern; a first voltage application circuit applying a first voltage to the first surface; a second voltage application circuit applying a second voltage to the second surface; and a detector for acquiring an inspection image generated from the pattern by irradiating the electron beam, wherein $|V_{acc}-V_L|=|V_2|<|V_1|$ is satisfied, when an acceleration voltage of an electron included in the electron beam is $V_{acc}$, an incident voltage of the electron reaching the second surface is denoted by $V_L$, the first voltage is denoted by $V_1$, and the second voltage is denoted by $V_2$.

Figure 1:
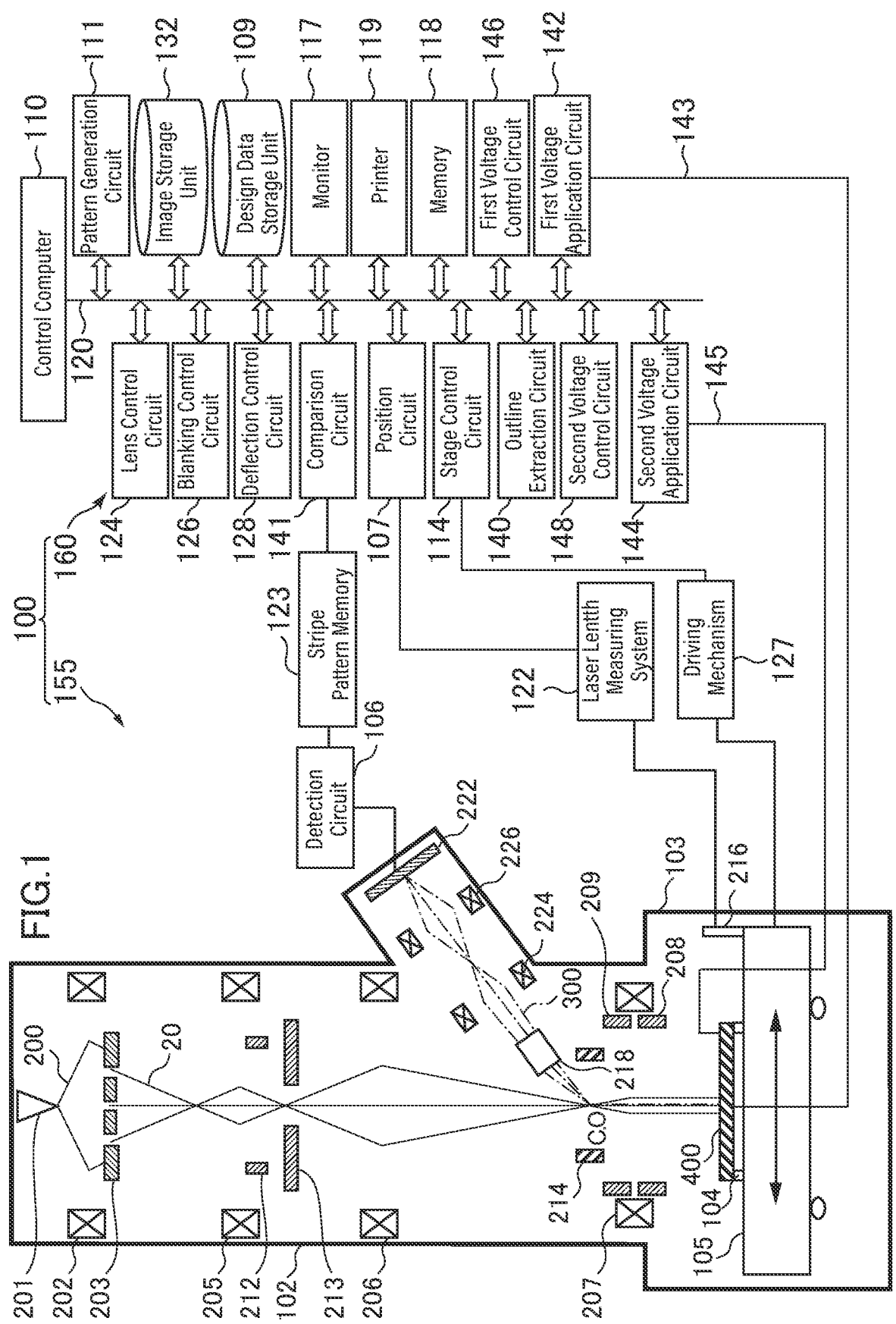
FIG. 1 is a schematic configuration diagram of a inspection apparatus according to an embodiment.

FIG. 1 is a block diagram showing the configuration of a inspection apparatus in present embodiment. In FIG. 1, an inspection apparatus 100 that inspects a pattern formed on a substrate is an example of a charged particle beam inspection apparatus. Electron-beam is one example of charged particle beam. Inspection apparatus 100 includes an electro-optical image acquiring mechanism (image acquiring mechanism) 155, and a control system circuit 160 (control unit). The electro-optical image acquiring mechanism (image acquiring mechanism) 155 includes a electron beam column 102 (electron optical column), inspection room 103, a detecting circuit 106, a stripe pattern memory 123, a driving mechanism 127, and a laser length measuring system 122. Within electron beam column 102 is disposed a electron gun (irradiation source) 201, an electromagnetic lens 202, a shaping aperture array substrate 203, a reduction lens 205, an electromagnetic lens 206, an objective lens 207, a main deflector 208, a sub deflector 209, a collective blanking deflector 212, a limited aperture substrate 213, a beam separator 214, an electromagnetic lens 224,226, and a multi-detector 222. The multi-detector 222 is an example of a detector.

A XY stage (target object stage) 105 movable at least in the X-Y plane is disposed in inspection room 103. On the XY stage 105, an inspection target object (EUV-mask) 400 is placed. Inspection target object (EUV-mask) 400 is disposed, for example, on the support 104 provided on XY stage 105 with the patterning surface facing upward. In addition, a mirror 216 that reflects laser light for laser length measurement emitted from the laser length measurement system 122 disposed outside the inspection chamber 103 is disposed on the XY stage 105. The multi-detector 222 is connected to the detection circuit 106 outside the electron beam column 102. The detection circuit 106 is connected to the stripe pattern memory 123.

In the control system circuit 160, the control computer 110 which is a computer is connected to a position circuit 107, a pattern generation circuit 111, a stage control circuit 114, a lens control circuit 124, a blanking control circuit 126, a deflection control circuit 128, an image storage unit 132, a filter circuit 139, an outline extraction circuit 140, a comparison circuit 141, a guide image generation circuit 142, a division circuit 143, an alignment circuit 144, a design data storage unit 109 such as a magnetic disk drive, a monitor 117, a memory 118, and a printer 119 via a bus 120. The XY stage 105 is also driven by a drive mechanism 127 under the control of the stage control circuit 114.

In the driving mechanism 127, for example, a driving system, such as a 3-axis (X-Y-θ) motor that drives in the X direction, the Y direction, and the θ direction is configured and the XY stage 105 is movable. For example, step motors can be used as an X motor, a Y motor, and a θ motor which are not illustrating. The XY stage 105 can be moved in the horizontal direction and the rotation direction by the motors of the X, Y, and θ axes. Then, the movement position of the XY stage 105 is measured by the laser length measurement system 122 and is supplied to the position circuit 107. The laser length measurement system 122 receives reflected light from the mirror 216 and measures the position of the XY stage 105 using the principle of laser interferometry.

A high-voltage power supply circuit (not illustrated) is connected to the electron gun assembly 201, and thus, an acceleration voltage from the high-voltage power supply circuit is applied between a filament (not illustrated) in the electron gun assembly 201 and an extraction electrode. By the application with the predetermined voltage of the extraction electrode and heating of the cathode (filament) at a predetermined temperature, a group of the electrons emitted from the cathode are accelerated, and thus, an electron beam is emitted. The reduction lens 205 and the objective lens 207 are, for example, electromagnetic lenses and are controlled by the lens control circuit 124. The beam separator 214 is also controlled by the lens control circuit 124. The collective blanking deflector 212 is composed of an electrode group of at least two poles and is controlled by the blanking control circuit 126. Each of the main deflector 208 and the sub deflector 209 includes at least four electrodes, and is controlled by the deflecting controller 128.

Design pattern data on which a mask pattern is formed in inspection target object (EUV-mask) 400 is inputted from the outside of inspection apparatus 100 and stored in the design data storage unit 109.

Here, in FIG. 1, a configuration necessary for explaining the embodiment is illustrated. In general, the inspection apparatus 100 may have other necessary configurations.

Figure 2:
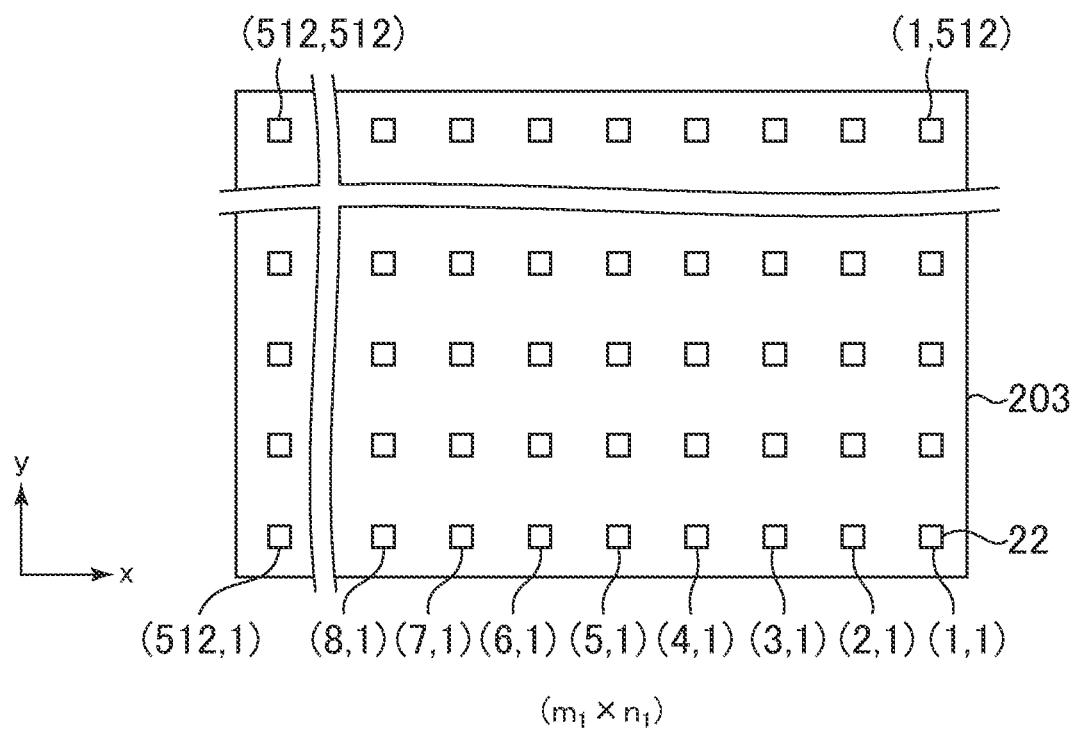
FIG. 2 is a conceptual diagram illustrating the configuration of shaping aperture array substrate in the embodiment.

FIG. 2 is a conceptual diagram showing the configuration of shaping aperture array substrate 203 in present embodiment. In FIG. 2, in shaping aperture array substrate 203, two-dimensional horizontal (x-direction) $m_1$ column×vertical (y-direction) $n_1$ stage holes ($m_1$, $n_1$ is two or more integers) 22 (opening portion) is formed with a predetermined array pitch in the x, y direction. In FIG. 2, 512×512 holes (opening portions) 22 are formed. Each hole 22 is formed in a rectangular shape having the same dimensions. Alternatively, a circular shape having the same outer diameter may be used. By passing a portion of the electron beams 200 through these plurality of holes 22, respectively, so that multiple primary electron beams 20 is formed. Herein, the example in which two or more columns of holes 22 are disposed in both the horizontal and vertical directions (x, y directions) is illustrated, but embodiments are not limited thereto. For example, there may be a plurality of columns in one of the horizontal and vertical directions (x, y directions), and there may be only one column in the other direction. In addition, as illustrated in FIG. 2, the method of arrangement of the holes 22 is not limited to a case where the holes are disposed in a lattice in the horizontal and vertical directions. For example, the holes in the k-th column in the vertical direction (y direction) and the holes in the (k+1)-th column may be disposed so as to be shifted by the dimension "a" in the horizontal direction (x direction). Similarly, the holes in the (k+1)-th column in the vertical direction (y direction) and the holes in the (k+2)-th column may be disposed so as to be shifted by the dimension "b" in the horizontal direction (x direction). Next, the operation of the electro-optical image acquiring mechanism 155 in inspection apparatus 100.

The electron beams 200 emitted from electron gun 201 (emission source) is refracted by the electromagnetic lens 202 to illuminate the entire shaping aperture array substrate 203. As illustrated in FIG. 2, a plurality of holes 22 (opening portions) are formed in the shaping aperture array substrate 203 and the electron beams 200 illuminate a region including all of the plurality of holes 22. Each of the electron beams 200 emitted to the positions of the plurality of holes 22 passes through each of the plurality of holes 22 of the shaping aperture array substrate 203 to form multiple primary electron beams (multiple beams) 20.

The formed multiple primary electron beams 20 are refracted by the electromagnetic lens (reduction lens) 205 and the electromagnetic lens 206, respectively, and while repeating the intermediate image and performing the crossover, the multiple primary electron beams 20 pass through the beam separator 214 disposed at the positions of crossover each beam of the multiple primary electron beams 20 and propagate to the electromagnetic lens 207 (objective lens). The electromagnetic lens 207 focuses multiple primary electron beams 20 on inspection target object 400. Multiple primary electron beams 20 focused on inspection target object 400 by the electromagnetic lenses 207 is collectively deflected by the main deflector 208 and the sub deflector 209 and irradiated to respective illumination positions on inspection target object 400. In addition, in a case where the entire multiple primary electron beams 20 are deflected collectively by the collective blanking deflector 212, the position deviates from the center hole of the limited aperture substrate 213 to be blocked by the limited aperture substrate 213. On the other hand, the multiple primary electron beams 20 not deflected by the collective blanking deflector 212 passes through the center hole of the limited aperture substrate 213 as illustrated in FIG. 1. The collective blanking deflector 212 is turned on and off to perform blanking control, and the turn-on and turn-off of the beams are collectively controlled. As a result, the limited aperture substrate 213 shields the multiple primary electron beams 20 deflected by the collective blanking deflector 212 so as to be in the beam OFF state. Then, the multiple primary electron beams 20 for inspection (for image acquisition) are formed by a group of beams formed having passed through the limited aperture substrate 213 after the beams are turned ON and before the beams are turned OFF.

A flux of secondary electrons (multiple secondary electron beams 300) containing reflected electrons corresponding to each beam of multiple primary electron beams 20 is emitted from the inspection target object 400 due to such multiple primary electron beams 20 being illuminated when multiple primary electron beams 20 is illuminated at a desired location to the inspection target object 400.

Multiple secondary electron beams 300 emitted from inspection target object 400 passes through the electromagnet 207 to the beam separator 214.

Herein, the beam separator 214 generates an electric field and a magnetic field in directions perpendicular to the plane perpendicular to the direction in which the center beam of the multiple primary electron beams 20 propagates (the center axis of the electron trajectory). The electric field exerts a force in the same direction regardless of the traveling direction of electrons. In contrast, the magnetic field exerts a force according to Fleming's left-hand rule. Therefore, it is possible to change the direction of the force acting on the electron depending on the entrance direction of the electron. With respect to the multiple primary electron beams 20 that intrude into the beam separator 214 from the upper side, the force due to the electric field and the force due to the magnetic field are canceled out by each other, and thus, the multiple primary electron beams 20 travel straight downward. On the other hand, with respect to the multiple secondary electron beams 300 that intrude into the beam separator 214 from the lower side, the force due to the electric field and the force due to the magnetic field act in the same direction, and thus, the multiple secondary electron beams 300 are bent obliquely upward to be separated from the multiple primary electron beams 20.

The multiple secondary electron beams 300 which are bent obliquely upward to be separated from the multiple primary electron beams 20 is further bent by the deflector 218 and projected on the multi-detector 222 while being refracted by the electromagnetic lenses 224 and 226. The multi-detector 222 detects the projected multiple secondary electron beams 300. The reflected electrons and secondary electrons may be projected onto the multi-detector 222, or the reflected electrons may diverge on the way, and thus, the remaining secondary electrons may be projected. The multi-detector 222 has, for example, a two-dimensional sensor (not illustrated). Then, each secondary electron of the multiple secondary electron beams 300 collides with a corresponding region of the two-dimensional sensor to generate an electron, and secondary electron image data is generated for each pixel. An intensity signal detected by the multi-detector 222 is output to the detection circuit 106.

Figure 3:
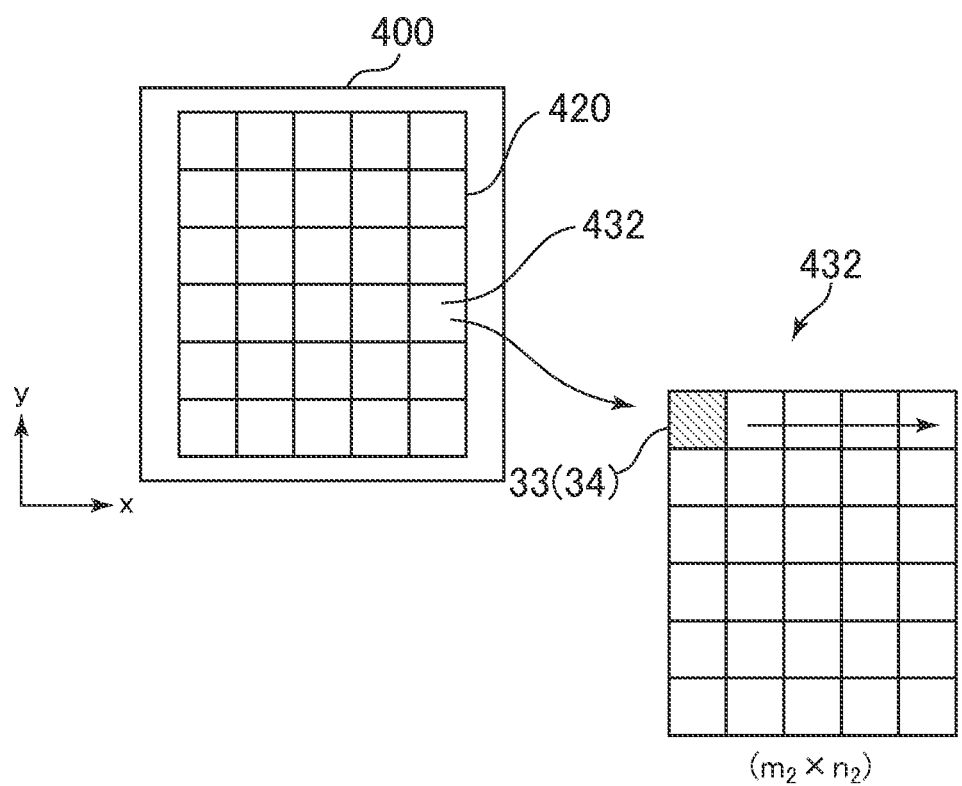
FIG. 3 is a diagram showing an example of a plurality of chip regions formed on a substrate according to the embodiment.

FIG. 3 is a diagram illustrating an exemplary of a plurality of chip regions formed in inspection target object 400 in present embodiment; In FIG. 3, a plurality of mask patterns 432 are formed in two-dimensional arrays on a first region 420 of inspection target object 400. The First region 420 is, for example, an inspection area. A mask pattern for one chip formed on a mask substrate for exposure is transferred onto each mask pattern 432 with the mask pattern being reduced by, for example, ¼ by an exposing apparatus (stepper) (not illustrated). Within each mask pattern 432, for example, a two-dimensional horizontal (x-direction) $m_2$ column×vertical (y-direction) $n_2$ stage ($m_2$, $n_2$ is 2 or more integers) It is divided into a plurality of mask dies 33. In present embodiment, such a mask die 33 is a unit inspection region. In FIG. 3, the second region 422 and the third region 424, which will be described later, are not illustrated.

Figure 4:
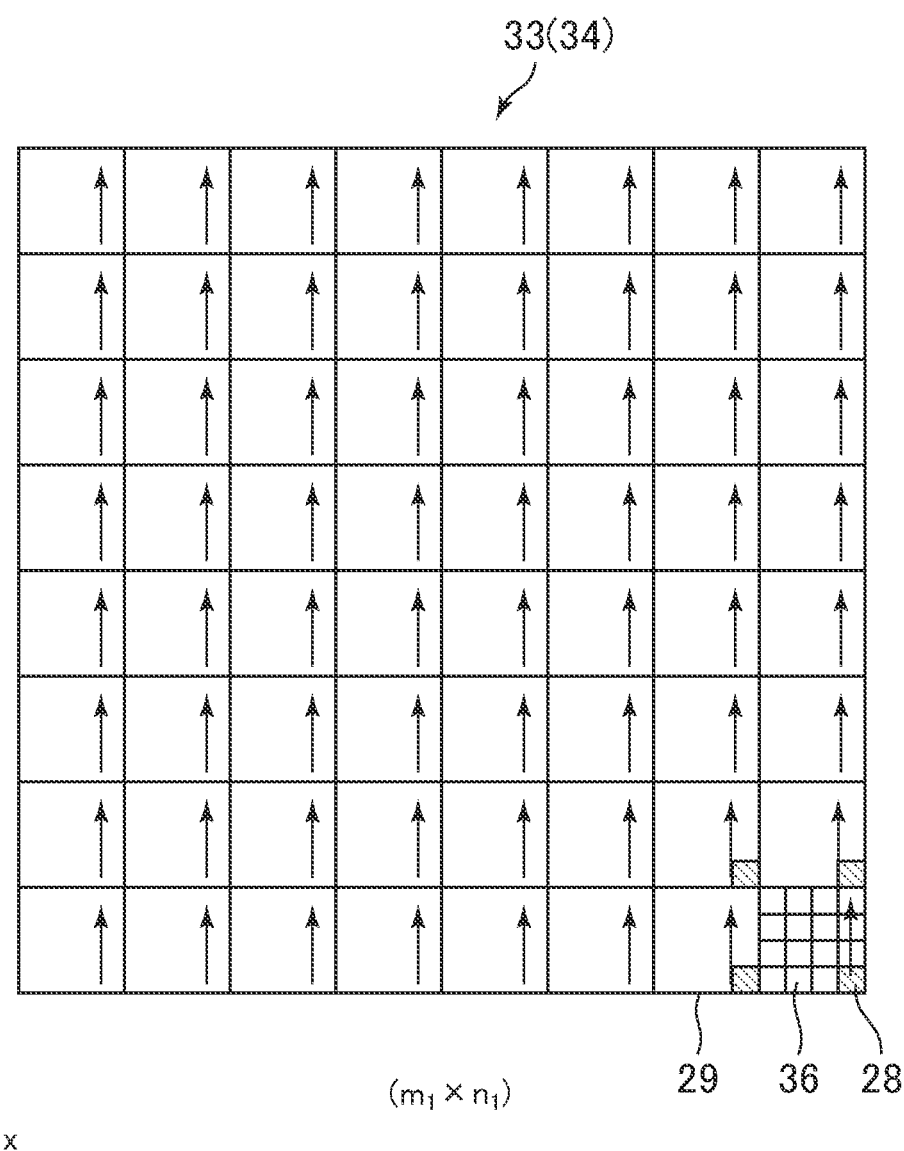
FIG. 4 is a diagram illustrating an exemplary irradiated area of multiple beams and measurement pixel in the embodiment.

FIG. 4 is a diagram illustrating an example of an irradiation region of multiple beams and measurement pixels according to the present embodiment. In FIG. 4, each mask die 33 is divided into a plurality of mesh regions in a mesh shape, for example, with a beam diameter of each of multiple beams. Each of these mesh regions becomes a measurement pixel 36 (unit irradiation region). The example of FIG. 4 illustrates the case of 8×8 columns of multiple beams. The irradiation region 34 that can be irradiated by one irradiation of the multiple primary electron beams 20 is defined to have an area of (the size in the x direction obtained by multiplying the pitch between beams of the multiple primary electron beams 20 in the x direction by the number of beams in the x direction)×(the size in the y direction obtained by multiplying the pitch between beams of the multiple primary electron beams 20 in the y direction by the number of beams in the y direction). FIG. 4 illustrates a case where the irradiation region 34 has the same size as the mask die 33. However, the size may not be limited. The irradiated region 34 may be smaller than the mask die 33. Alternatively, The irradiated region 34 may be larger than the mask die 33. Then, a plurality of measurement pixels 28 (beam irradiation positions at the time of one shot) that can be irradiated by one irradiation of the multiple primary electron beams 20 are illustrated in the irradiation region 34. In other words, the pitch between the adjacent measurement pixels 28 becomes the pitch between the multiple beams. In the example of FIG. 4, one sub-irradiation region 29 is formed by a square region surrounded by four adjacent measurement pixels 28 and including one measurement pixel 28 among the four measurement pixels 28. In the example of FIG. 4, a case where each sub-irradiation region 29 is configured with 4×4 pixels 36 is illustrated.

In the scan operation in the present embodiment, scanning is performed for each mask die 33. In the example of FIG. 4, an example in which one certain mask die 33 is scanned is illustrated. If all of multiple primary electron beams 20 is used, then $m_1 \times n_1$ sub-irradiation regions 29 will be arranged in the x and y directions (in a two-dimensional fashion) within one illumination region 34. The XY stage 105 is moved to be stopped at a position where the first mask die 33 can be irradiated with the multiple primary electron beams 20. At this position, the entire multiple primary electron beams 20 are collectively deflected to the reference position of the mask die 33 scanned with the multiple primary electron beams 20 by the main deflector 208, and the inside of the mask die 33 is scanned by setting the mask die 33 as the irradiation region 34 (scanning operation). In a case where the scanning is performed while the XY stage 105 is continuously moved, tracking deflection is performed by the main deflector 208 so as to further follow the movement of the XY stage 105. Each beam being composed by the multiple primary electron beams 20 will be responsible for any of the sub-irradiation regions 29 that differ from each other. Then, at the time of each shot, one measurement pixel 28 corresponding to the same position within the assigned sub-irradiation region 29 is irradiated with each beam. In the example of FIG. 4, each beam is deflected by the sub deflector 209 so as to irradiate the first measurement pixel 36 from the right of the lowest stage in the assigned sub-irradiation region 29 with the first shot. Then, irradiation of the first shot is performed. Subsequently, the beam deflection positions of the entire multiple primary electron beams 20 are collectively shifted in the y direction by one measurement pixel 36 by the sub deflector 209, and the first measurement pixel 36 from the right of the second stage from the bottom in the assigned sub-irradiation region 29 is irradiated with the second shot. Similarly, the first measurement pixel 36 from the right of the third stage from the bottom in the assigned sub-irradiation region 29 is irradiated with the third shot. The first measurement pixel 36 from the right of the fourth stage from the bottom in the assigned sub-irradiation region 29 is irradiated with the fourth shot. Next, the beam deflection positions of the entire multiple primary electron beams 20 are collectively shifted to the position of the second measurement pixel 36 from the right of the lowest stage by the sub deflector 209, and similarly, the measurement pixels 36 are sequentially irradiated in the y direction. By repeating the operation, all the measurement pixels 36 in one sub-irradiation region 29 are sequentially irradiated with one beam. In one shot, by the multiple beams formed by passing through each hole 22 of the shaping aperture array substrate 203, the multiple secondary electron beams 300 corresponding to a plurality of shots of which number is maximally the same as the number of holes 22 are detected at a time.

As described above, the mask die 33 as the irradiation region 34 is scanned by the entire multiple primary electron beams 20, but the corresponding one sub-irradiation region 29 is scanned by each beam. Then, when the scanning of one mask die 33 is completed, the next adjacent mask die 33 moves so as to be the irradiation region 34, and the next adjacent mask die 33 is scanned. This operation is repeated, and the scanning of one chip 332 is advanced. Each time when the shot of the multiple primary electron beams 20 is performed, the multiple secondary electron beams 300 are emitted from the irradiated measurement pixel 36 and detected by the multi-detector 222. In the present embodiment, the unit detection region size of the multi-detector 222 detects the multiple secondary electron beams 300 emitted upward from each measurement pixel 36 for each measurement pixel 36 (or each sub-irradiation region 29).

By performing scanning using the multiple primary electron beams 20 as described above, a scanning operation (measurement) can be performed at a higher speed than in the case of scanning using a single beam. In addition, the scanning of each mask die 33 may be performed by a step-and-repeat operation, or the scanning of each mask die 33 may be performed while the XY stage 105 is continuously moved. In a case where the irradiation region 34 is smaller than the mask die 33, the scanning operation may be performed while moving the irradiation region 34 in the mask die 33.

As described above, the electro-optical image acquisition mechanism 155 scans the substrate (wafer) 101 on which the pattern is formed by using the multiple primary electron beams 20 and detects the multiple secondary electron beams 300 emitted from the substrate (wafer) 101 due to the irradiation of the multiple primary electron beams 20. Secondary electron detection data (secondary electron image) from the measurement pixels 36 detected by the multi-detector 222 are output to the detection circuit 106 in the order of measurement. In the detection circuit 106, analog detection data are converted into digital data by an A/D converter (not illustrated) and stored in the stripe pattern memory 123. Then, for example, at a stage where the detection data for one chip 332 is accumulated, the chip pattern data together with the information indicating each position from the position circuit 107 are transmitted to the comparison circuit 141.

Figure 5:
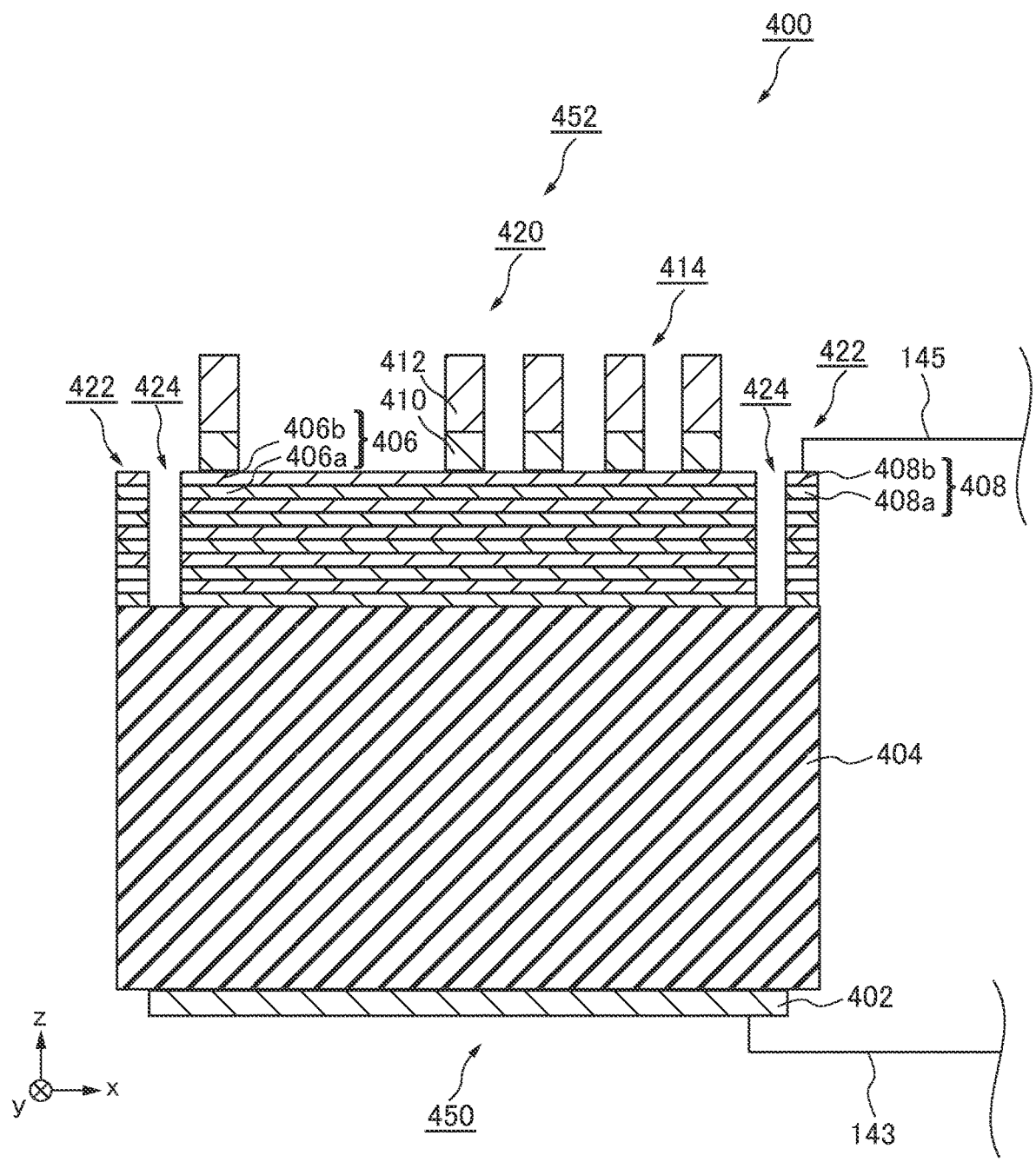
FIG. 5 is a schematic cross-sectional view of a EUV-mask used in an embodiment.

FIG. 5 is a schematic cross-sectional view of the inspection target object (EUV-mask) 400 used in the embodiment.

The inspection target object 400 has a first surface 450 and a second surface 452 provided on the opposite side of first surface 450

A substrate 404 is used for inspection target object 400 As the substrate 404, a substrate using synthetic quartz or a substrate using extremely low thermal expansion glass having a coefficient of thermal expansion smaller than that of quartz is preferably used in order to suppress thermal distortion during exposure.

The first surface 450, which is also one surface of the substrate 404, the first conductive film 402 is provided. The first conductive film 402 is formed of, for example, CrN (chromium nitride). It is desirable that the surface of inspection target object (EUV-mask) 400 be completely flat. In reality, however, due to the initial shape of the substrate 404 and stresses associated with the formation of Si/Mo multilayer films or absorbers, inspection target object (EUV-mask) 400 has flatness errors caused by the shape of the substrate and the substrate deformation. Therefore, the unevenness of the reflecting surface for reflecting EUV light may be formed as a pattern distortion on the wafer. In order to suppress this, an electrostatic chuck has been introduced to the fixation of the inspection target object (EUV-mask) 400 in the evaporation equipment and exposure equipment of Si/Mo multilayer film. A first conductive film 402 is used to secure the mask to such an electrostatic chuck. As a result, since the inspection target object (EUV-mask) 400 can be held by electrostatic force, the flatness of the patterns is maintained.

Note that on the first surface 450, the fourth area 401 where the first conductive film 402 is not provided around the first conductive film 402 may be provided. When inspection target object 400 is supported on the XY stage 105, an area where the first conductive film is not provided is supported by the supporting portion 104, whereby the first conductive film can be prevented from being damaged.

The second surface 452, which is also the other side of the substrate 404, is provided with the first region 420, the second region 422, and the third region 424. The second region 422 is provided around the first region 420. The third region 424 is provided between the first region 420 and the second region 422. For example, the second region 422 is provided so as to surround the third region 424. For example, the third region 424 is provided so as to surround the first region 420.

In the first region 420, a second conductive film 406 is provided. Here, the second conductive film 406 is a multi-layer film in which a first Si film 406a containing Si and a first Mo film 406b containing Mo are stacked in a predetermined number of cycles, for example, about 40 cycles or more and 60 cycles or less. The second conductive film 406 is a reflective film of EUV light. In FIG. 5, the stacking number of the Si film 406a and the Mo film 406b is omitted.

The buffer layer 410 is provided on the second conductive film 406. The buffer layer 410 is provided to protect the second conductive film 406 during etching of the absorber 412, which will be described later, and during defect correction of the absorber 412.

The absorber 412 is provided on top of buffer layer 410. Patterns 414 are formed on the buffer layer 410 and the absorber 412. The patterns 414 includes, for example, a plurality of mask patterns 432 shown in FIG. 3. Note that an oxide layer or the like (not illustrated) may be further provided on the absorber 412.

The third conductive film 408 is provided in the second region 422. Here, the third conductive film 408 is a multi-layered film in which a second Si film 408a containing Si and a second Mo film 408b containing Mo are laminated in a predetermined number of cycles, for example, in the range of 40 cycles to 60 cycles, and is a reflective film of EUV light. In FIG. 5, the stacking number of the Si film 408a and the Mo film 408b is omitted. Note that a buffer layer, an absorber, an oxide layer, or the like (not illustrated) may be further provided on the third conductive film 408.

None of a silicon film, a molybdenum film, a buffer layer, an absorber, and an oxide layer are provided in the third region 424 In other words, in third region 424, the surface of the substrate 404 is exposed. The third region 424 is an area called a black border. The third region 424 is an area provided to suppress unintentional exposure due to the exposure light reflected by portions other than the patterns 414 at the time of exposure.

The first voltage application circuit 142 (FIG. 1) applies a first voltage $V_1$ and a first fine voltage (first infinitesimal voltage) $\Delta V_1$ smaller than the first voltage $V_1$ to the first surface 450 via the first conductive film 402, by using, for example, the wire 143. Here, the first voltage $V_1$ is, for example, a negative voltage. The magnitude of the first voltage $V_1$ is, for example, about several tens of kilovolts. On the other hand, the second voltage application circuit 144 (FIG. 1) applies a second voltage $V_2$ and a second fine voltage (second infinitesimal voltage) $\Delta V_2$ smaller than the second voltage $V_2$ to the second surface 452 via the third conductive film 408, by using, for example, the wire 145. Here, the first fine voltage $\Delta V_1$ and the second fine voltage $\Delta V_2$ are changed according to the thickness of inspection target object 400.

Note that when the second voltage $V_2$ and the second fine voltage $\Delta V_2$ are applied, for example, the tip of the wiring 145 may be sharpened, and the oxide layer or the like may be destroyed so that the third conductive film and the wiring 145 are in direct contact with each other, or the oxide layer or the like may be removed in advance.

The first fine voltage $\Delta V_1$ and the second fine voltage $\Delta V_2$ can be changed as appropriate, for example, by an operator or by the control computer 110 during the examination. Alternatively, for example, the first voltage control circuit 146 and the second voltage control circuit 148 may be used to vary the first fine voltage $\Delta V_1$ and the second fine voltage $\Delta V_2$ as appropriate for focusing or depending on the thickness of the substrate 404.

The first fine voltage $\Delta V_1$ and the second fine voltage $\Delta V_2$ may, of course, be 0 volts. In this instance, the first voltage application circuit 142 is used to apply the first voltage $V_1$ to the first surface 450, and the second voltage application circuit 144 is used to apply the second voltage $V_2$ to the second surface 452.

It is preferable that $|V_{acc}-V_L|=|V_2+\Delta V_2|<|V_1+\Delta V_1|$ is satisfied, when an acceleration voltage of an electron included in the electron beam is $V_{acc}$ and an incident voltage of the electron reaching the second surface is denoted by $V_L$. Note that when the first fine voltage $\Delta V_1$ and the second fine voltage $\Delta V_2$ are 0 volts, the above relation is $|V_{acc}-V_L|=|V_2|$. Here, the incident voltage $V_L$ of the electron is obtained by converting the landing energy $E_L$ (in eV) when the electron included in the electron beams reach the second surface 452 into a voltage. For example, the relation between the landing energy $E_L$ and the incident voltage $V_L$ is expressed by the relational expression of $E_L/(1.6\times10^{-19})=V_L$. An example of the acceleration voltage $V_{acc}$ is 10 kV, an example of incident voltage $V_L$ is 2 kV, an example of the first voltage $V_1$ is −13 kV, and an example of the second voltage $V_2$ is −8 kV. Note that the acceleration voltage $V_{acc}$, incident voltage $V_L$, the first voltage $V_1$, and the second voltage $V_2$ are not limited to the voltages described above.

It is preferable that the first voltage $V_1$ and the first fine voltage $\Delta V_1$ satisfies $|V_1/100|\leq|\Delta V_1|\leq|V_1/10|$. Further, it is preferable that the second voltage $V_2$ and the second fine voltage $\Delta V_2$ satisfies $|V_2/100|\leq|\Delta V_2|\leq|V_2/10|$.

The configuration of the first voltage application circuit 142 and the second voltage application circuit 144 is not particularly limited. For example, the first voltage application circuit 142 may include a first voltage main circuit for applying the first voltage $V_1$ and a first voltage assist circuit for applying the first fine voltage $\Delta V_1$, but the present invention is not limited thereto. The same applies to the second voltage application circuit 144.

Figure 6:
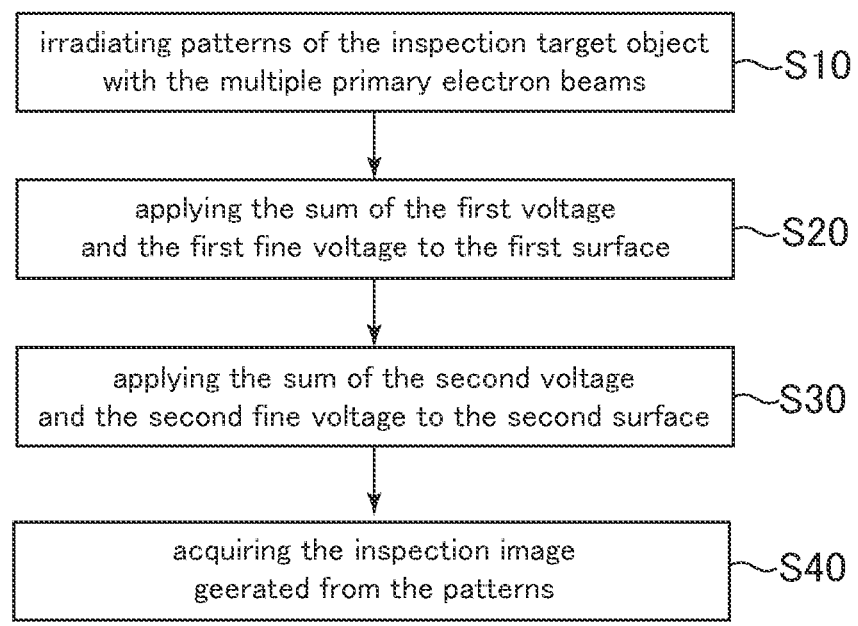
FIG. 6 is a flow chart of a inspection method in an embodiment.

FIG. 6 is a flow chart of a inspection method in an embodiment.

First, the inspection target object 400 is placed on, e.g., support 104 of XY stage 105. Next, the patterns 414 of the inspection target object 400 are irradiated with the multiple primary electron beams 20 (S10). Next, the sum of the first voltage $V_1$ and the first fine voltage $\Delta V_1$ is applied to the first surface 450 through the first conductive film 402 by using the first voltage application circuit 142 (S20). Next, the sum of the second voltage $V_2$ and the second fine voltage $\Delta V_2$ is applied to second surface 452 through the third conductive film 408 by using the second voltage application circuit 144 in step (S30). Next, the multiple secondary electron beams 300 generated from the patterns 414 are detected by using the multi-detector 222, and an inspection image is acquired by using the detection circuit 106, further, or the like (S40). Incidentally, for example, the order of the application of the sum of the first voltage $V_1$ and the first fine voltage $\Delta V_1$, and the sum of the second voltage $V_2$ and the second fine voltage $\Delta V_2$, is not particularly limited to those described above. For example, the order may be as follows. That is, the sum of the first voltage $V_1$ and the first fine voltage $\Delta V_1$ is applied to the first surface 450 through the first conductive film 402 using the first voltage application circuit 142 (S20), and at almost the same time, the sum of the second voltage $V_2$ and the second fine voltage $\Delta V_2$ is applied to the second surface 452 through the third conductive film 408 using the second voltage application circuit 144 (S30). Thereafter, the patterns 414 of the inspection target object 400 are irradiated with the multiple primary electron beams 20 (S10). Next, the multiple secondary electron beams 300 generated from the patterns 414 are detected by using the multi-detector 222, and an inspection image is acquired by using the detection circuit 106, further, or the like (S40).

Next, the effects of the inspection apparatus and the inspection method of present embodiment will be described.

As in the inspection apparatus of the present embodiment, by applying the sum of the first voltage $V_1$ and the first voltage fine voltage $\Delta V_1$ to first surface 450, there is no need to separately provide a region for applying the retarding voltage to the patterned region of second surface 452. Therefore, more elements can be formed in the region for applying the above retarding voltage. Therefore, it is possible to provide the inspection apparatus capable of both improving the device yield and acquiring the inspection images having high resolution.

In particular, EUV-mask is provided with the first conductive film 402 on the first surface 450 to maintain the flatness of the patterns as described above. Therefore, it is possible to easily apply a voltage to the first surface 450 via the first conductive film.

Figure 7:
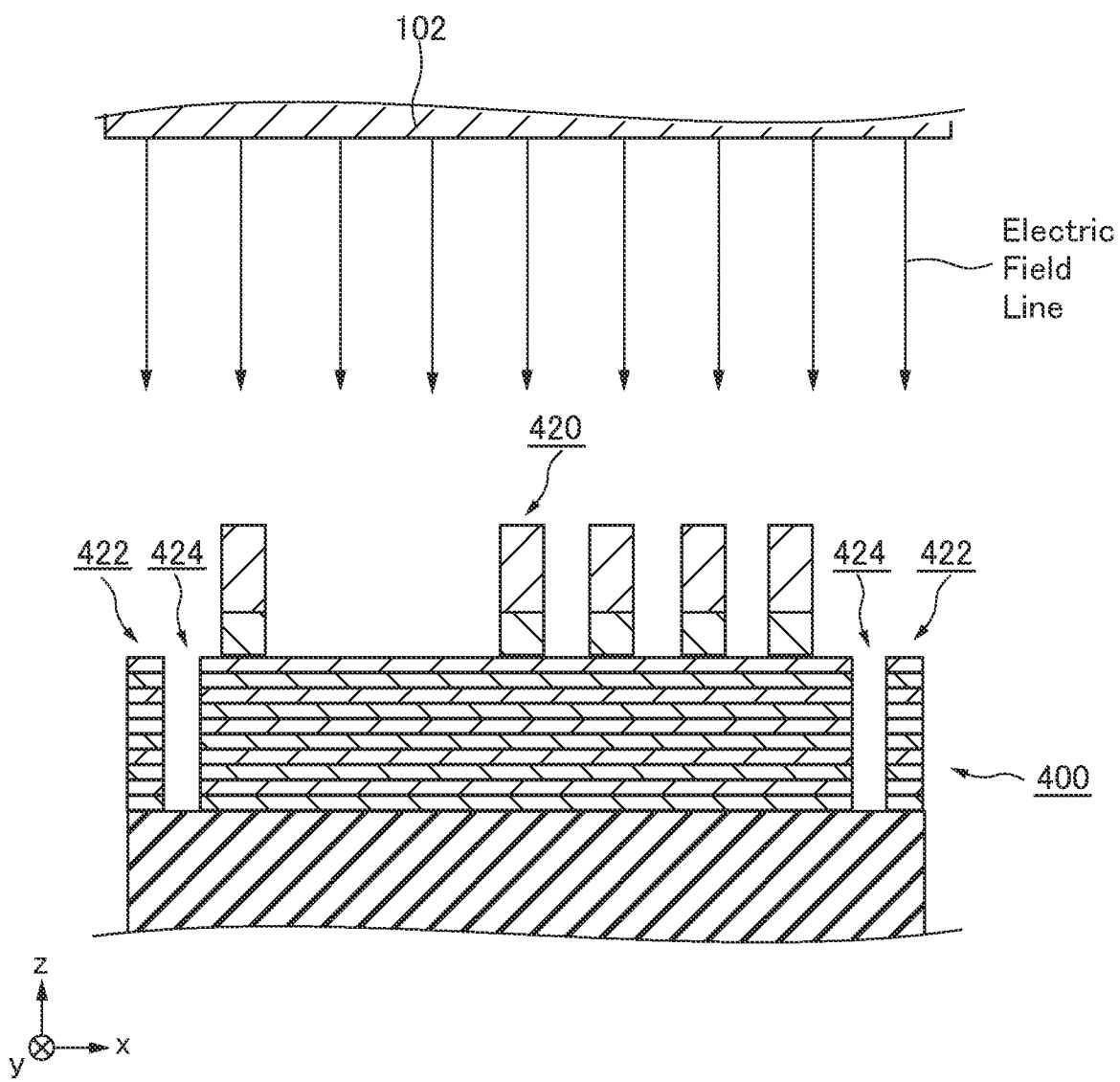
FIG. 7 is a schematic diagram for explaining the operation and effects of inspection apparatus of the embodiment.

FIG. 7 is a schematic diagram for explaining the operation and effects of the present embodiment. The potential of the electron beam column 102 (electron optical column) is, for example, 0V. Compared to the central portion of first region 420, for example, the edge portion of first region 420, the border portion of the first region 420 and the third region 424, and the like are susceptible to distortion in electric potential distribution or electric field line. Therefore, when the sum of the second voltage $V_2$ and the second voltage fine voltage $\Delta V_2$ is applied to the second surface 452 through the third conductive film 408, the distortion described above can be corrected. Incidentally, the shape of the electron beam column 102 (electron optical column) shown in FIG. 7 is shown for explanation of electric potential distribution or electric field line, and it is not consistent with the shape in the actual inspection apparatus 100.

It is preferable that $|V_{acc}-V_L|=|V_2+\Delta V_2|<|V_1+\Delta V_1|$ is satisfied, when an acceleration voltage of the electron included in the electron beam is $V_{acc}$ and an incident voltage of the electron reaching the second surface is denoted by $V_L$. First, when a desired incident voltage $V_L$ for the inspection is arbitrarily set, it can be considered that the voltage $|V_2+\Delta V_2|$, which is equal to $|V_{acc}-V_L|$, i.e. the absolute value of the difference between the acceleration voltage $V_{acc}$ and the predetermined incident voltage $V_L$, may be applied to the second surface 452. This can be expressed as $|V_{acc}-V_L|=|V_2+\Delta V_2|$. For example, when the potential of the electron beam column 102 (electron optical column) is 0V as described above, $V_2+\Delta V_2$ is a negative voltage.

Then, considering the magnitude relationship between $|V_2+\Delta V_2|$ and $|V_1+\Delta V_1|$, the substrate 404 is provided between the third conductive film 408 and the first conductive film 402. Therefore, in order to make electric field line uniform at the second surface 452, it is preferable to apply $|V_1+\Delta V_1|$, which is higher than $|V_2+\Delta V_2|$, considering that the substrate 404 is provided. Thus, it is preferable to that $|V_2+\Delta V_2|<|V_1+\Delta V_1|$ is satisfied.

Thus, it is preferable that $|V_{acc}-V_L|=|V_2+\Delta V_2|<|V_1+\Delta V_1|$ is satisfied.

The thickness of the substrate 404 is not uniform and varies depending on the location on each substrate 404 to be inspected. For example, when the thickness of the substrate 404 is about several mm, the thickness of the substrate 404 may differ by about 100 μm depending on the location.

Therefore, the magnitude of the first voltage $V_1$ and the second voltage $V_2$ is preferably changed to focus. Therefore, it is preferable that the first voltage $V_1$ is changed by the first voltage fine voltage $\Delta V_1$ in accordance with the thickness of inspection target object 400. The second voltage $V_2$ is preferably changed by the second voltage fine voltage $\Delta V_2$ in accordance with the thickness of inspection target object 400.

The relationship of the magnitude between the first voltage $V_1$ and the first fine voltage $\Delta V_1$ is determined by the relationship between the mean thickness of the substrate 404 and the amount of change in the thickness depending on the location of the substrate 404. For example, with respect to the average film thickness of the substrate 404, the amount of change in the thickness depending on the position of the substrate 404 is considered to be about 1% or more and 10% or less. From this, it is preferable that $|V_1/100| \leq |\Delta V_1| \leq |V_1/10|$ is satisfied. Similarly for the second voltage $V_2$ and the second fine voltage $\Delta V_2$, it is preferable that $|V_2/100| \leq |\Delta V_2| \leq |V_2/10|$ is satisfied.

The embodiment's inspection apparatus and inspection method provide inspection apparatus and inspection method that can both improve device yield and acquire the inspection images with high resolution.

In the above description, a series of "circuits" includes processing circuits, and the processing circuits include an electric circuit, a computer, a processor, a circuit board, a quantum circuit, a semiconductor device, or the like. Each "circuit" may use a common processing circuit (the same processing circuit). Alternatively, a different processing circuit (separate processing circuit) may be used. A program for executing a processor or the like may be recorded on a recording medium such as a magnetic disk drive, a magnetic tape device, an FD, or a read only memory (ROM). In addition, a "memory unit", a "storage unit", or a memory device includes, for example, a recording medium such as a magnetic disk drive, a magnetic tape device, an FD, a ROM (read only memory), or a solid state drive (SSD).

Heretofore, the embodiments have been described with reference to specific examples. The above-described embodiments are merely examples and do not limit embodiments. For example, in the embodiments, an illustration has been given in which EUV-mask is used as a inspection target object However, the inspection target object may not be EUV-mask. Further, for example, the explanation has been given for the inspection apparatus for irradiating multiple beams in the embodiment. However, the inspection apparatus is not necessary to irradiate the multiple electron beams. In addition, the constituent elements of each embodiment may be appropriately combined.

In the embodiment, description of portions and the like which are not directly required for the description of the present invention, such as the configuration of inspection method and inspection apparatus and the manufacturing method thereof, have been omitted, but the required configurations of inspection method and inspection apparatus can be appropriately selected and used. In addition, all inspection method and inspection apparatus which are provided with the elements of the present invention and which can be appropriately designed and modified by those skilled in the art are encompassed by the scope of the present invention. The scope of embodiments is defined by the claims and their equivalents.

What is claimed is:

1. An inspection apparatus comprising:
   an irradiation source irradiating an electron beam to a pattern of an inspection target object, the inspection target object having a first surface and a second surface having the pattern;
   a first voltage application circuit configured to apply a first voltage to the first surface;
   a second voltage application circuit configured to apply a second voltage to the second surface; and
   a detector for acquiring an inspection image generated from the pattern by irradiating the electron beam,
   wherein $|V_{acc} - V_L| = |V_2| < |V_1|$ is satisfied, when an acceleration voltage of an electron included in the electron beam is $V_{acc}$, an incident voltage of the electron reaching the second surface is denoted by $V_L$, the first voltage is denoted by $V_1$, and the second voltage is denoted by $V_2$.

2. The inspection apparatus as claimed in claim 1, wherein:
   the inspection target object further includes a first conductive layer provided on the first surface, and
   the first voltage application circuit is configured to apply the first voltage to the first surface through the first conductive layer.

3. The inspection apparatus according to claim 1, wherein the second surface further includes
   a first region having a second conductive film and an absorber provided on the second conductive film and having the pattern, and
   a second region provided around the first region and having a third conductive film, and
   the second voltage application circuit is configured to apply the second voltage to the second surface through the third conductive film.

4. The inspection apparatus according to claim 3, wherein the second surface further includes a third region provided between the first region and the second region, and the absorber is not provided in the third region, and
   the second voltage application circuit is configured to apply the second voltage to the second surface having the third region.

5. The inspection apparatus according to claim 4, wherein the third region is provided to surround the first region.

6. The inspection apparatus according to claim 1,
   wherein the first voltage application circuit is configured to apply a sum of the first voltage and a first fine voltage smaller than the first voltage to the first surface, and
   wherein $|V_{acc} - V_L| < |V_1 + \Delta V_1|$ is satisfied, when the first fine voltage is denoted by $\Delta V_1$.

7. The inspection apparatus according to claim 6, wherein $|V_1/100| \leq |\Delta V_1| \leq |V_1/10|$ is satisfied.

8. The inspection apparatus according to claim 6,
   wherein the second voltage application circuit is configured to apply a sum of the second voltage and a second fine voltage smaller than the second voltage to the second surface, and
   wherein $|V_{acc} - V_L| < |V_2 + \Delta V_2| < |V_1 + \Delta V_1|$ is satisfied, when the second fine voltage is denoted by $\Delta V_2$.

9. The inspection apparatus according to claim 8, wherein $|V_2/100| \leq |\Delta V_2| \leq |V_2/10|$ is satisfied.

* * * * *